United States Patent
Khlat

(10) Patent No.: US 10,797,650 B2
(45) Date of Patent: Oct. 6, 2020

(54) ENVELOPE TRACKING AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 14 days.

(21) Appl. No.: 16/193,513

(22) Filed: Nov. 16, 2018

(65) Prior Publication Data

US 2020/0036337 A1    Jan. 30, 2020

Related U.S. Application Data

(60) Provisional application No. 62/702,627, filed on Jul. 24, 2018.

(51) Int. Cl.
*H03F 1/02* (2006.01)
*H03F 3/195* (2006.01)
*H03F 3/21* (2006.01)

(52) U.S. Cl.
CPC .......... *H03F 1/0211* (2013.01); *H03F 3/195* (2013.01); *H03F 3/211* (2013.01); *H03F 2200/102* (2013.01); *H03F 2200/129* (2013.01); *H03F 2200/321* (2013.01); *H03F 2200/375* (2013.01); *H03F 2200/451* (2013.01)

(58) Field of Classification Search
CPC .................................................. H03F 1/0211
See application file for complete search history.

(56) References Cited

U.S. PATENT DOCUMENTS

| 6,529,716 B1 | 3/2003 | Eidson et al. |
| 6,788,151 B2 | 9/2004 | Shvarts et al. |
| 8,019,289 B2 | 9/2011 | Gorbachov |
| 8,290,453 B2 | 10/2012 | Yoshihara |
| 8,385,859 B2 | 2/2013 | Hamano |
| 8,600,321 B2 | 12/2013 | Nambu et al. |
| 8,611,402 B2 | 12/2013 | Chiron |

(Continued)

OTHER PUBLICATIONS

Non-Final Office Action for U.S. Appl. No. 16/263,368, dated Dec. 26, 2019, 6 pages.

(Continued)

*Primary Examiner* — Patricia T Nguyen
(74) *Attorney, Agent, or Firm* — Withrow & Terranova, P.L.L.C.

(57) ABSTRACT

An envelope tracking (ET) amplifier apparatus is provided. The ET amplifier apparatus includes an amplifier circuit configured to amplify a radio frequency (RF) signal based on a modulated voltage. In examples discussed herein, the amplifier circuit is co-located with a local voltage amplifier circuit configured to supply the modulated voltage such that a trace inductance between the amplifier circuit and the local voltage amplifier circuit can be reduced to below a defined threshold. By co-locating the amplifier circuit with the local voltage amplifier circuit to reduce a coupling distance between the amplifier circuit and the local voltage amplifier circuit and thus the trace inductance associated with the coupling distance, it may be possible to reduce degradation in the modulated voltage. As a result, it may be possible to improve efficiency and maintain linearity in the amplifier circuit, particularly when the RF signal is modulated at a higher modulation bandwidth.

20 Claims, 3 Drawing Sheets

(56) References Cited

U.S. PATENT DOCUMENTS

| | | | |
|---|---|---|---|
| 8,665,016 B2 | 3/2014 | Chowdhury et al. |
| 8,665,931 B2 | 3/2014 | Afsahi et al. |
| 8,803,603 B2 | 8/2014 | Wimpenny |
| 8,816,272 B1 | 8/2014 | Brown et al. |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1 | 6/2015 | Yan et al. |
| 9,197,162 B2* | 11/2015 | Chiron | H03F 1/02 |
| 9,197,256 B2 | 11/2015 | Khlat |
| 9,246,460 B2* | 1/2016 | Khlat et al. | H03G 3/3042 |
| 9,247,496 B2 | 1/2016 | Khlat |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1 | 4/2017 | Rozenblit et al. |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 | 11/2017 | Balteanu et al. |
| 9,831,934 B2 | 11/2017 | Kotecha et al. |
| 9,843,294 B2* | 12/2017 | Khlat | H04W 52/0209 |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,330 B1 | 12/2018 | Khlat |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,789 B2 | 10/2019 | Brunel et al. |
| 10,454,428 B2 | 10/2019 | Khesbak et al. |
| 10,476,437 B2 | 11/2019 | Nag et al. |
| 2004/0100323 A1 | 5/2004 | Khanifer et al. |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 | 6/2012 | Khesbak |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0111279 A1 | 4/2014 | Brobston |
| 2014/0306763 A1 | 10/2014 | Hong et al. |
| 2014/0361837 A1* | 12/2014 | Strange et al. | H03F 1/0222 |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0094186 A1 | 3/2016 | Cohen |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0294587 A1* | 10/2016 | Jiang et al. | H04L 25/4902 |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0353287 A1 | 12/2017 | Onaka et al. |
| 2018/0048276 A1* | 2/2018 | Khlat et al. | H03G 3/3036 |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222181 A1 | 7/2019 | Khlat |
| 2019/0267947 A1 | 8/2019 | Khlat et al. |

OTHER PUBLICATIONS

Notice of Allowance for U.S. Appl. No. 16/273,288, dated Dec. 13, 2019, 8 pages.

Non-Final Office Action for U.S. Appl. No. 16/263,316, dated Dec. 23, 2019, 9 pages.

Non-Final Office Action for U.S. Appl. No. 16/250,229, dated Apr. 29, 2020, 7 pages.

Non-Final Office Action for U.S. Appl. No. 16/267,740, dated Apr. 30, 2020, 10 pages.

Final Office Action for U.S. Appl. No. 16/263,316, dated May 13, 2020, 10 pages.

Notice of Allowance for U.S. Appl. No. 16/270,119, dated Jun. 18, 2020, 9 pages.

Final Office Action for U.S. Appl. No. 16/263,368, dated May 22, 2020, 9 pages.

Non-Final Office Action for U.S. Appl. No. 16/250,298, dated Aug. 20, 2020, 8 pages.

* cited by examiner

ENVELOPE TRACKING AMPLIFIER APPARATUS

RELATED APPLICATIONS

This application claims the benefit of U.S. Provisional Patent Application Ser. No. 62/702,627, filed on Jul. 24, 2018, the disclosure of which is incorporated herein by reference in its entirety.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Notably, the better the time-variant voltage envelope tracks the time-variant power envelope, the higher efficiency can be achieved in the ET power amplifier(s). In this regard, it may be necessary for the ET system to constantly adjust the time-variant voltages applied to the ET power amplifier(s) to ensure that the ET power amplifier(s) can consistently operate at a desired efficiency for any given instantaneous power requirement of the RF signal(s).

SUMMARY

Aspects disclosed in the detailed description include an envelope tracking (ET) amplifier apparatus. The ET amplifier apparatus includes an amplifier circuit configured to amplify a radio frequency (RF) signal based on a modulated voltage (e.g., ET voltage). In examples discussed herein, the amplifier circuit is co-located with a local voltage amplifier circuit configured to supply the modulated voltage such that a trace inductance between the amplifier circuit and the local voltage amplifier circuit can be reduced to below a defined threshold (e.g., <0.4 nH). By co-locating the amplifier circuit with the local voltage amplifier circuit to reduce a coupling distance between the amplifier circuit and the local voltage amplifier circuit and thus the trace inductance associated with the coupling distance, it may be possible to reduce degradation in the modulated voltage. As a result, it may be possible to improve efficiency and maintain linearity in the amplifier circuit, particularly when the RF signal is modulated at a higher modulation bandwidth (e.g., >80 MHz).

In one aspect, an ET amplifier apparatus is provided. The ET amplifier apparatus includes a tracker circuit comprising a main voltage amplifier circuit configured to generate a main modulated voltage. The ET amplifier apparatus also includes an amplifier apparatus coupled to the tracker circuit. The amplifier apparatus includes a local voltage amplifier circuit configured to generate a local modulated voltage. The amplifier apparatus also includes an amplifier circuit configured to amplify an RF signal based on a modulated voltage. The ET amplifier apparatus also includes a control circuit. The control circuit is configured to activate the amplifier circuit in response to the RF signal being modulated above a defined modulation bandwidth. The control circuit is also configured to activate the local voltage amplifier circuit to provide the local modulated voltage to the amplifier circuit as the modulated voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
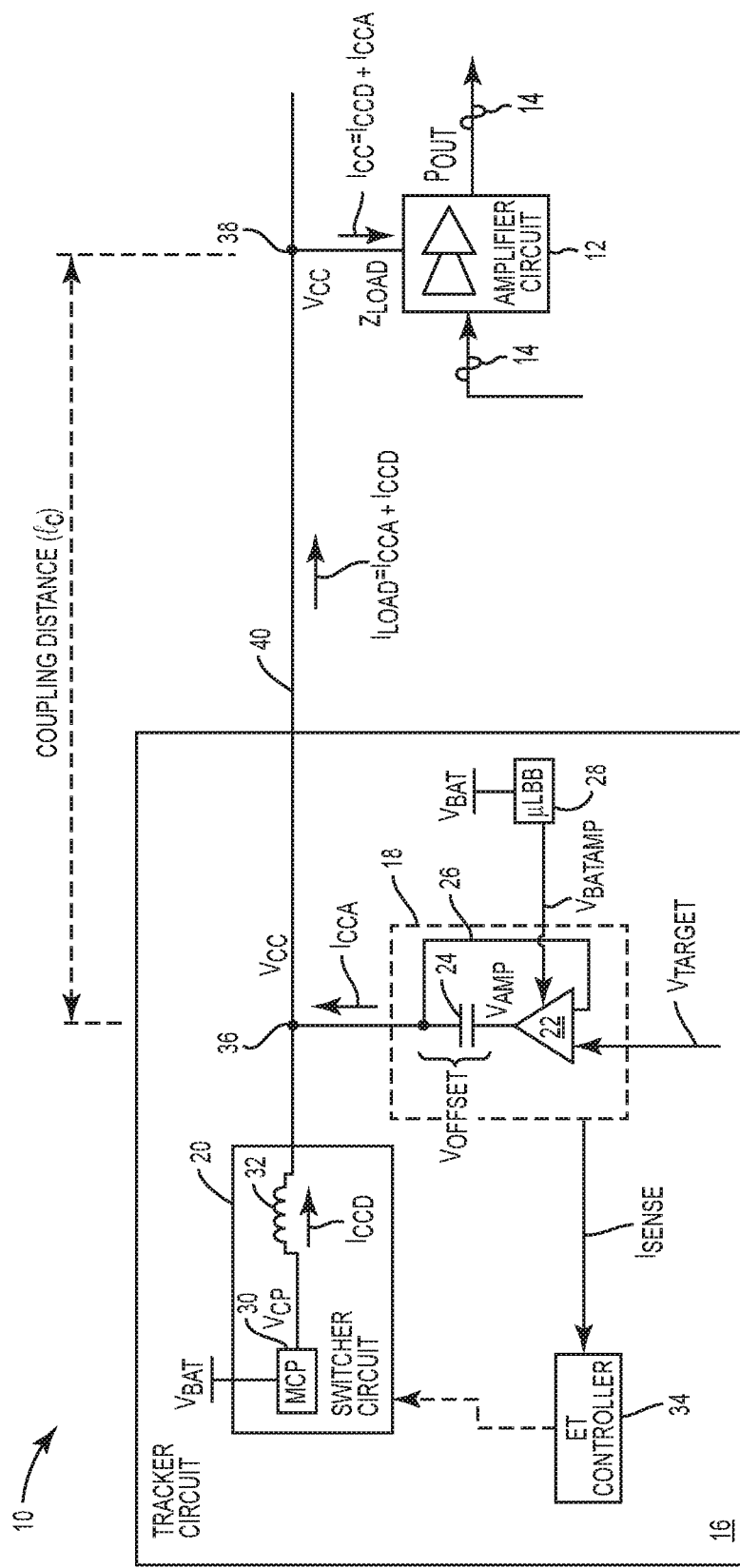
FIG. 1 is a schematic diagram of an exemplary existing envelope tracking (ET) amplifier apparatus in which an amplifier circuit can suffer degraded efficiency and linearity due to trace inductance associated with a long coupling distance.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) amplifier apparatus. The ET amplifier apparatus includes an amplifier circuit configured to amplify a radio frequency (RF) signal based on a modulated voltage (e.g., ET voltage). In examples discussed herein, the amplifier circuit is co-located with a local voltage amplifier circuit configured to supply the modulated voltage such that a trace inductance between the amplifier circuit and the local voltage amplifier circuit can be reduced to below a defined threshold (e.g., <0.4 nH). By co-locating the amplifier circuit with the local voltage amplifier circuit to reduce a coupling distance between the amplifier circuit and the local voltage amplifier circuit and thus the trace inductance associated with the coupling distance, it may be possible to reduce degradation in the modulated voltage. As a result, it may be possible to improve efficiency and maintain linearity in the amplifier circuit, particularly when the RF signal is modulated at a higher modulation bandwidth (e.g., >80 MHz).

Before discussing the ET amplifier apparatus of the present disclosure, a brief overview of an existing ET amplifier apparatus is first provided with reference to FIG. 1 to help understand how a trace inductance can be caused to negatively impact operating efficiency of an amplifier circuit in the existing ET amplifier apparatus. The discussion of specific exemplary aspects of an ET amplifier apparatus starts below with reference to FIG. 2.

In this regard, FIG. 1 is a schematic diagram of an exemplary existing ET amplifier apparatus 10 in which an amplifier circuit 12 can suffer degraded efficiency and linearity due to trace inductance associated with a long coupling distance $l_C$. The amplifier circuit 12 is configured to amplify an RF signal 14 based on a modulated voltage (e.g., ET voltage) $V_{CC}$. Dependent on a specific application, the RF signal 14 may be modulated below a defined modulation bandwidth (e.g., ≤80 MHz) or above the defined modulation bandwidth (e.g., >80 MHz). The RF signal 14 may correspond to a higher peak-to-average ratio (PAR), particularly when the RF signal 14 is modulated above the defined modulation bandwidth. In this regard, the RF signal 14 may be associated with time-variant amplitudes that define a time-variant power envelope.

The tracker circuit 16 includes at least one voltage amplifier circuit 18 and at least one switcher circuit 20. The voltage amplifier circuit 18 includes a voltage amplifier 22 configured to generate an amplifier voltage $V_{AMP}$ based on a modulated target voltage $V_{TARGET}$ and a supply voltage $V_{BATAMP}$. The modulated target voltage $V_{TARGET}$ may correspond to a time-variant target voltage envelope that tracks the time-variant power envelope of the RF signal 14. Accordingly, the voltage amplifier 22 generates the amplifier voltage $V_{AMP}$ having a time-variant voltage envelope that rises and falls in accordance to the time-variant target voltage envelope.

The voltage amplifier circuit 18 may include an offset capacitor 24 coupled to the voltage amplifier 22. The offset capacitor 24 may be configured to raise the amplifier voltage $V_{AMP}$ by a defined offset voltage $V_{OFFSET}$ (e.g., 0.8 V) to generate the modulated voltage $V_{CC}$ ($V_{CC}=V_{AMP}+V_{OFFSET}$). In this regard, the modulated voltage $V_{CC}$ corresponds to the time-variant voltage envelope that tracks the time-variant target voltage envelope and, therefore, the time-variant power envelope of the RF signal 14.

The amplifier circuit 12 may have an inherent load impedance $Z_{LOAD}$ that can cause a load current $I_{LOAD}$ based on the modulated voltage $V_{CC}$. In this regard, the amplifier circuit 12 may act like a current source/sink to the tracker circuit 16. Given that the modulated voltage $V_{CC}$ rises and falls in accordance to the time-variant power envelope of the RF signal 14, the load current $I_{LOAD}$ may likewise rise or fall based on the time-variant power amplitude of the RF signal 14. Accordingly, the amplifier circuit 12 may output the RF signal 14 at a desired output power $P_{OUT}$ that is positively related to the load current $I_{LOAD}$ and the load impedance $Z_{LOAD}$.

The voltage amplifier circuit 18 may include a feedback loop 26 configured to provide a sample of the modulated voltage $V_{CC}$ back to the voltage amplifier 22. In this regard, the voltage amplifier 22 may be referred to as a closed-loop voltage amplifier. The tracker circuit 16 may include a micro inductor-based buck-boost (µLBB) circuit 28 configured to generate the supply voltage $V_{BATAMP}$ based on a battery voltage $V_{BAT}$. As the name suggests, the µLBB circuit 28 may operate in a buck mode to output the supply voltage $V_{BATAMP}$ at the battery voltage $V_{BAT}$ or in a boost mode to output the supply voltage $V_{BATAMP}$ at two-times the battery voltage $V_{BAT}$ ($2 \times V_{BAT}$).

The switcher circuit 20 includes a multi-level charge pump (MCP) 30 configured to generate a multi-level voltage $V_{CP}$ based on the battery voltage $V_{BAT}$. The MCP 30 may be configured to generate the multi-level voltage $V_{CP}$ at 0 V, $V_{BAT}$, or $2 \times V_{BAT}$. The switcher circuit 20 may include a current inductor 32 coupled in series to the MCP 30. The current inductor 32 may be configured to induce a low-frequency current $I_{CCD}$ based on the multi-level voltage $V_{CP}$. The current inductor 32 may inherently have a relatively large inductance. Accordingly, the current inductor 32 may generate the low-frequency current $I_{CCD}$ closer to a direct current (DC).

When the RF signal 14 is modulated at below the defined modulation bandwidth, the load current $I_{LOAD}$ may be constituted entirely by the low-frequency current $I_{CCD}$. However, when the RF signal 14 is modulated well above the defined modulation bandwidth (e.g., 200 MHz), the low-frequency current $I_{CCD}$ may not be sufficient for the amplifier circuit 12 to amplify the RF signal 14 to the desired output power $P_{OUT}$, particularly when the time-variant power envelope of the RF signal 14 swings rapidly between peak and bottom power levels. As a result, the voltage amplifier 22 may be forced to source an alternate current $I_{CCA}$ to make up the deficit of the low-frequency $I_{CCD}$. In contrast, when the RF signal 14 remains at a relatively stable power level, the low-frequency current $I_{CCD}$ may be sufficient for the amplifier circuit 12 to amplify the RF signal 14 to the desired output power $P_{OUT}$. As such, the voltage amplifier 22 may be force to act as a current sink to absorb excessive alternate current.

In this regard, the voltage amplifier circuit 18 may be configured to generate a sense current $I_{SENSE}$ indicative of the alternate current $I_{CCA}$ sourced or sunk by the voltage amplifier 22. The tracker circuit 16 may include an ET controller 34, which can be a bang-bang controller (BBC) for example. The ET controller 34 may receive the sense current $I_{SENSE}$ from the voltage amplifier circuit 18. Accordingly, the ET controller 34 may control the switcher circuit 20 to adjust (increase or decrease) the low-frequency current $I_{CCD}$.

The voltage amplifier circuit 18 may be configured to generate the modulated voltage $V_{CC}$ at a first coupling node 36. The amplifier circuit 12, on the other hand, may be coupled to a second coupling node 38 to receive the modulated voltage $V_{CC}$. The first coupling node 36 may be coupled to the second coupling node 38 via a conductive trace 40 over the coupling distance $l_C$.

As the load current $I_{LOAD}$ flows from the first coupling node 36 toward the second coupling node 38, the conductive trace 40 can induce a trace inductance $L_T$ (also known as self-inductance) that is positively related to the coupling distance $l_C$. The trace inductance L may cause a trace voltage $V_L$ across the conductive trace, as can be estimated based on the equation (Eq. 1) below.

$$V_L = -L_T \frac{\Delta I_{LOAD}}{\Delta t} \tag{Eq. 1}$$

In the equation above, $L_T$ represents the trace inductance of the conductive trace 40 and $\Delta I_{Load}/\Delta t$ represents a time-variant change of the load current $I_{LOAD}$. Notably, the trace voltage $V_L$ can cause the modulated voltage $V_{CC}$ to fluctuate at the second coupling node 38. As such, the modulated voltage $V_{CC}$ may be out of alignment with the time-variant power envelope of the RF signal 14, thus causing the amplifier circuit 12 to suffer degraded efficiency and linearity. Moreover, the $\Delta I_{LOAD}/\Delta t$ can increase to result in a larger trace voltage $V_L$ when the RF signal is modulated at a higher modulation bandwidth. As such, it may be desired to reduce the trace inductance $L_T$ between the tracker circuit 16 and the amplifier circuit 12 to achieve a desired efficiency and linearity in the amplifier circuit 12.

Figure 2:
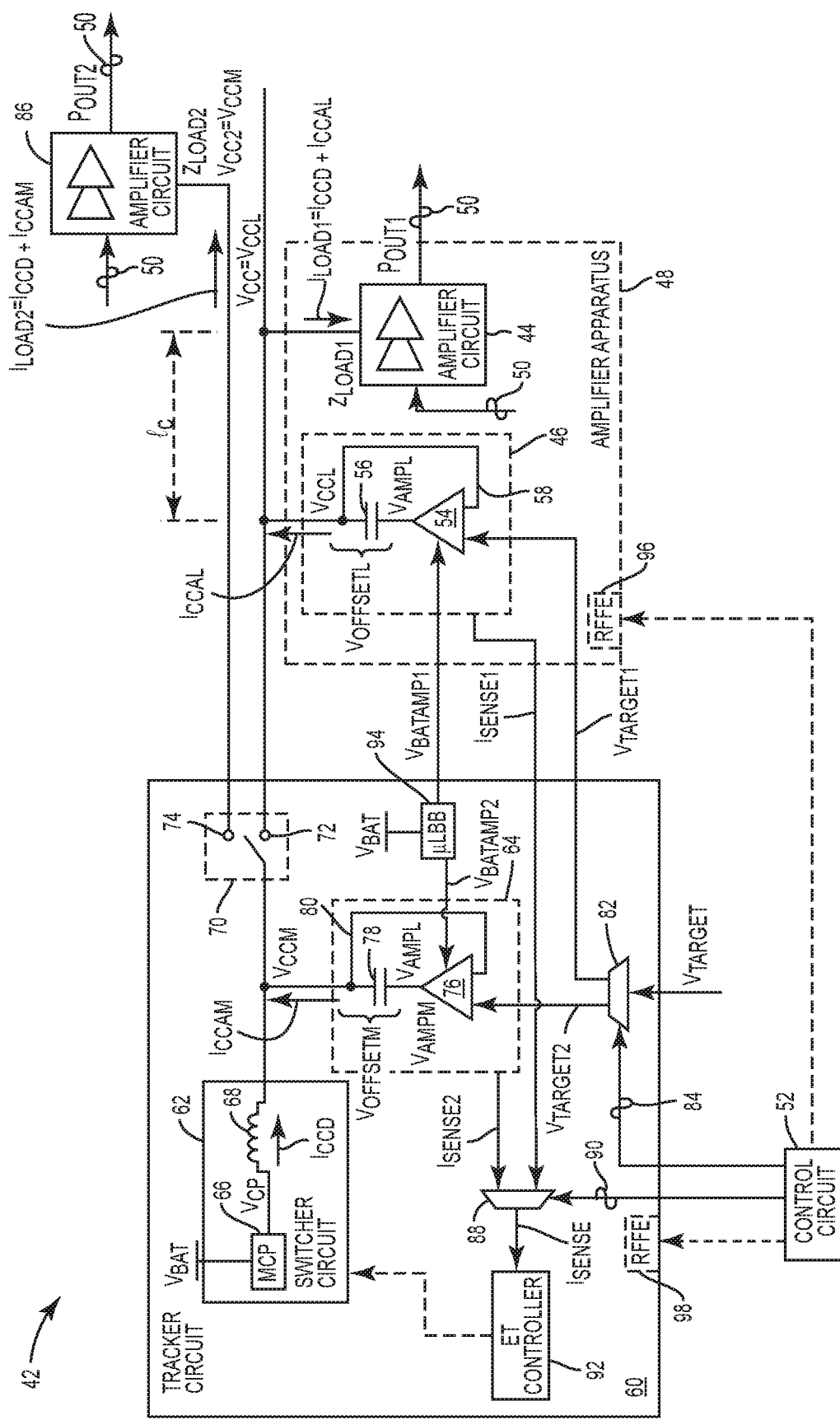
FIG. 2 is a schematic diagram of an exemplary ET amplifier apparatus configured according to an embodiment of the present disclosure to reduce the trace inductance in the existing ET amplifier apparatus of FIG. 1 by co-locating an amplifier circuit with a local voltage amplifier circuit.

In this regard, FIG. 2 is a schematic diagram of an exemplary ET amplifier apparatus 42 configured according to an embodiment of the present disclosure to reduce the trace inductance $L_T$ in the existing ET amplifier apparatus 10 of FIG. 1 by co-locating an amplifier circuit 44 with a local voltage amplifier circuit 46. In a non-limiting example, the amplifier circuit 44 and the local voltage amplifier circuit 46 can be provided in separate semiconductor dies, but integrated in an amplifier apparatus 48.

The amplifier circuit 44 is configured to amplify an RF signal 50 based on a modulated voltage $V_{CC}$. The local voltage amplifier circuit 46 is configured to generate a local modulated voltage $V_{CCL}$, which can be provided to the amplifier circuit 44 as the modulated voltage $V_{CC}$. By co-locating the local voltage amplifier circuit 46 with the amplifier circuit 44 in the amplifier apparatus 48, it may be possible to reduce the coupling distance $l_C$ between the local voltage amplifier circuit 46 and the amplifier circuit 44. Therefore, it may be possible to reduce the trace inductance $L_C$ associated with the coupling distance $l_C$ to below a defined threshold (e.g., <0.4 nH), thus helping to reduce the trace voltage $V_L$, caused by the trace inductance $L_C$. As a result, it may be possible to reduce fluctuation in the modulated voltage $V_{CC}$ to help improve efficiency and linearity of the amplifier circuit 44, regardless of whether the RF signal 50 is modulated above or below the defined modulation bandwidth.

The ET amplifier apparatus 42 includes a control circuit 52, which can be a microprocessor, a microcontroller, or a field-programmable gate array (FPGA) for example. The control circuit 52 is configured to activate the amplifier circuit 44 to amplify the RF signal 50, particularly when the RF signal 50 is modulated above the defined modulation bandwidth. It should be appreciated that the control circuit 52 may also activate the amplifier circuit 44 even if the RF signal 50 is modulated below the defined modulation bandwidth. The control circuit 52 is further configured to activate the local voltage amplifier circuit 46 to provide the local modulated voltage $V_{CCL}$ to the amplifier circuit 44 as the modulated voltage $V_{CC}$, whenever the amplifier circuit 44 is activated. In this regard, the amplifier circuit 44 always receives the modulated voltage $V_{CC}$ from the local voltage amplifier circuit 46 over the reduced coupling distance $l_C$. As such, it may be possible to reduce fluctuation in the modulated voltage $V_{CC}$ caused by the trace inductance $L_C$, particularly when the RF signal 50 is modulated above the defined modulation bandwidth. As a result, it may be possible to maintain higher efficiency and linearity in the amplifier circuit 44.

The local voltage amplifier circuit 46 includes a local voltage amplifier 54 and a local offset capacitor 56 coupled in series with the local voltage amplifier 54. The local voltage amplifier 54 is configured to generate a local amplifier voltage $V_{AMPS}$ based on a first target voltage $V_{TARGET1}$ and a first supply voltage $V_{BATAMP1}$. The first target voltage $V_{TARGET1}$ may correspond to a first time-variant target voltage envelope that tracks a time-variant power envelope of the RF signal 50. Accordingly, the local voltage amplifier 54 may generate the local amplifier voltage $V_{AMPL}$ that rises and falls in accordance to the time-variant power envelope of the RF signal 50.

The local offset capacitor 56 is configured to raise the local amplifier voltage $V_{AMPL}$ by a local offset voltage $V_{OFFSETL}$ (e.g., 0.8 V) to generate the local modulated voltage $V_{CCL}$ ($V_{CCL}=V_{AMPS}+V_{OFFSETL}$). Given that the local amplifier voltage $V_{AMPL}$ rises and falls in accordance to the time-variant power envelope of the RF signal 50, the local modulated voltage $V_{CCL}$ likewise rises and falls in accordance to the time-variant power envelope of the RF signal 50. The local voltage amplifier circuit 46 may include a local feedback loop 58 configured to provide a sample of the local modulated voltage $V_{CCL}$ back to the local voltage amplifier 54.

The amplifier circuit 44 may have an inherent first load impedance $Z_{LOAD1}$ that can cause a first load current $I_{LOAD1}$ based on the modulated voltage $V_{CC}$. In this regard, the amplifier circuit 44 may act like a current source/sink. Given that the modulated voltage $V_{CC}$ rises and falls in accordance to the time-variant power envelope of the RF signal 50, the first load current $I_{LOAD1}$ may likewise rise or fall along with the time-variant power amplitude of the RF signal 50. Accordingly, the amplifier circuit 44 may output the RF signal 50 at a desired output power $P_{OUT1}$ that is positively related to the first load current $I_{LOAD1}$ and the first load impedance $Z_{LOAD1}$.

The ET amplifier apparatus 42 includes a tracker circuit 60. In a non-limiting example, the tracker circuit 60 and the amplifier apparatus 48 are provided on separate circuit boards. The tracker circuit 60 includes at least one switcher circuit 62 and at least one main voltage amplifier circuit 64. The switcher circuit 62 and the main voltage amplifier circuit 64 may be functionally equivalent to the switcher circuit 20 and the voltage amplifier circuit 18 of FIG. 1, respectively. In this regard, the switcher circuit 62 is configured to generate a low-frequency current $I_{CCD}$ based on a battery voltage $V_{BAT}$ and the main voltage amplifier circuit 64 is configured to generate a main modulated voltage $V_{CCM}$ based on a second target voltage $V_{TARGET2}$ and a second supply voltage $V_{BATAMP2}$. In a non-limiting example, the control circuit 52 is configured to activate the switcher circuit 62 and deactivate the main voltage amplifier circuit 64 in response to activating the amplifier circuit 44 and the local voltage amplifier circuit 46.

The switcher circuit 62 includes an MCP 66 configured to generate a multi-level voltage $V_{CP}$ based on the battery voltage $V_{BAT}$. The MCP 66 may be configured to generate the multi-level voltage $V_{CP}$ at 0 V, $V_{BAT}$, or 2×$V_{BAT}$. The switcher circuit 62 may include a current inductor 68 coupled in series to the MCP 66. The current inductor 68 may be configured to induce the low-frequency current $I_{CCD}$ based on the multi-level voltage $V_{CP}$. The current inductor 68 may inherently have a relatively large inductance.

Accordingly, the switcher circuit 62 may generate the low-frequency current $I_{CCD}$ closer to a direct current (DC).

The control circuit 52 is configured to couple the amplifier circuit 44 to the switcher circuit 62 to receive the low-frequency current $I_{CCD}$ when the control circuit 52 activates the local voltage amplifier circuit 46 in the amplifier apparatus 48. In this regard, the first load current $I_{LOAD1}$ includes the low-frequency current $I_{CCD}$. The tracker circuit 60 may include a switching circuit 70 configured to toggle between at least one primary port 72 and at least one auxiliary port 74. In a non-limiting example, the control circuit 52 may toggle the switching circuit 70 to the primary port 72 to couple the amplifier circuit 44 to the switcher circuit 62.

The RF signal 50 may be associated with a relatively larger PAR when the RF signal 50 is modulated well above the defined modulation bandwidth (e.g., 200 MHz). Accordingly, the time-variant power envelope may swing rapidly between peak and bottom power levels from time to time. As such, the low-frequency current $I_{CCD}$ may not be sufficient for the amplifier circuit 44 to amplify the RF signal 50 to the desired output power $P_{OUT}$. As a result, the local voltage amplifier 54 may be forced to source a first alternate current $I_{CCAL}$ to make up the deficit of the low-frequency $I_{CCD}$. In contrast, when the RF signal 50 remains at a relatively stable power level, the low-frequency current $I_{CCD}$ may be sufficient for the amplifier circuit 44 to amplify the RF signal 50 to the desired output power $P_{OUT}$. As such, the local voltage amplifier 54 may be forced to act as a current sink to absorb excessive alternate current. In this regard, the local voltage amplifier circuit 46 may be configured to generate a first sense current $I_{SENSE1}$ indicative of the first alternate current $I_{CCAL}$ sourced or sunk by the local voltage amplifier 54.

The main voltage amplifier circuit 64 includes a main voltage amplifier 76 configured to generate a main amplifier voltage $V_{AMPM}$ based on the second target voltage $V_{TARGET2}$ and the second supply voltage $V_{BATAMP2}$. The main voltage amplifier circuit 64 may include a main offset capacitor 78 coupled to the main voltage amplifier 76. The main offset capacitor 78 may be configured to raise the main amplifier voltage $V_{AMPM}$ by a main offset voltage $V_{OFFSETM}$ (e.g., 0.8 V) to generate the main modulated voltage $V_{CCM}$ ($V_{CCM}=V_{AMPM}+V_{OFFSETM}$). The main voltage amplifier circuit 64 may include a main feedback loop 80 configured to provide a sample of the main modulated voltage $V_{CCM}$ back to the main voltage amplifier 76.

The tracker circuit 60 can be configured to include a target voltage de-multiplexer 82 configured to receive a modulated target voltage $V_{TARGET}$. The target voltage de-multiplexer 82 may be configured to output the modulated target voltage $V_{TARGET}$ as the first target voltage $V_{TARGET1}$ or the second target voltage $V_{TARGET2}$ based on a target voltage selection signal 84. In a non-limiting example, the control circuit 52 is configured to provide the target voltage selection signal 84 to the target voltage de-multiplexer 82. The control circuit 52 provides the target voltage selection signal 84 to cause the target voltage de-multiplexer 82 to output the first target voltage $V_{TARGET1}$ when the amplifier circuit 44 and the local voltage amplifier circuit 46 are activated.

The ET amplifier apparatus 42 may include a second amplifier circuit 86. The second amplifier circuit 86 is configured to amplify the RF signal 50 based on a second modulated voltage $V_{CC2}$. In a non-limiting example, the control circuit 52 activates the second amplifier circuit 86 only when the RF signal 50 is modulated below the defined modulation bandwidth. Accordingly, the control circuit 52 activates the switcher circuit 62 and the main voltage amplifier circuit 64. In addition, the control circuit 52 deactivates the amplifier circuit 44 and the local voltage amplifier circuit 46.

The control circuit 52 may couple the second amplifier circuit 86 to the main voltage amplifier circuit 64 by toggling the switching circuit 70 to the auxiliary port 74. Accordingly, the main voltage amplifier circuit 64 can provide the main modulated voltage $V_{CCM}$ to the second amplifier circuit 86 as the second modulated voltage $V_{CC2}$. The control circuit 52 is further configured to control the target voltage de-multiplexer 82 via the target voltage selection signal 84 to output the second target voltage $V_{TARGET2}$ when the second amplifier circuit 86 and the main voltage amplifier circuit 64 are activated.

The second amplifier circuit 86 may have an inherent second load impedance $Z_{LOAD2}$ that can cause a second load current $I_{LOAD2}$ based on the second modulated voltage $V_{CC2}$. In this regard, the second amplifier circuit 86 may act like a current source/sink. Given that the second modulated voltage $V_{CC2}$ rises and falls in accordance to the time-variant power envelope of the RF signal 50, the second load current $I_{LOAD2}$ may likewise rise or fall along with the time-variant power amplitude of the RF signal 50. Accordingly, the second amplifier circuit 86 may output the RF signal 50 at a second desired output power $P_{OUT2}$ that is positively related to the second load current $I_{LOAD2}$ and the second load impedance $Z_{LOAD2}$.

The control circuit 52 is configured to couple the second amplifier circuit 86 to the switcher circuit 62 to receive the low-frequency current $I_{CCD}$ when the control circuit 52 activates the main voltage amplifier circuit 64 in the tracker circuit 60. In this regard, the second load current $I_{LOAD2}$ includes the low-frequency current $I_{CCD}$. Similar to the local voltage amplifier 54, the main voltage amplifier 76 may need to provide a second alternate current $I_{CCAM}$ to the second amplifier circuit 86. In this regard, the main voltage amplifier circuit 64 may generate a second sense current $I_{SENSE2}$ indicative of the second alternate current $I_{CCAM}$ sourced or sunk by the main voltage amplifier 76.

The tracker circuit 60 may include a sense current multiplexer 88 configured to receive the first sense current $I_{SENSE1}$ and the second sense current $I_{SENSE2}$. The sense current multiplexer 88 may be controlled by a sense current selection signal 90 to output a selected sense current $I_{SENSE}$ among the first sense current $I_{SENSE1}$ and the second sense current $I_{SENSE2}$. The control circuit 52 may be configured to control the sense current multiplexer 88 via the sense current selection signal 90. Specifically, the control circuit 52 controls the sense current multiplexer 88 to output the first sense current $I_{SENSE1}$ as the selected sense current $I_{SENSE}$ when the amplifier circuit 44 and the local voltage amplifier circuit 46 are activated. In contrast, the control circuit 52 controls the sense current multiplexer 88 to output the second sense current $I_{SENSE2}$ as the selected sense current $I_{SENSE}$ when the second amplifier circuit 86 and the main voltage amplifier circuit 64 are activated.

The tracker circuit 60 may include an ET controller 92, which can be a BBC for example. The ET controller 92 receives the selected sense current $I_{SENSE}$ from the sense current multiplexer 88. Accordingly, the ET controller 92 controls the switcher circuit 62 to adjust (increase or decrease) the low-frequency current $I_{CCD}$. The tracker circuit 60 may also include a μLBB 94 configured to provide the first supply voltage $V_{BATAMP1}$ and the second supply voltage $V_{BATAMP2}$ to the local voltage amplifier 54 and the main voltage amplifier 76, respectively. In a non-limiting example, the μLBB 94 can operate in a buck mode to generate the first supply voltage $V_{BATAMP1}$ and the second supply voltage $V_{BATAMP2}$ at the battery voltage $V_{BAT}$. In another non-limiting example, μLBB 94 can operate in a boost mode to generate the first supply voltage $V_{BATAMP1}$ and the second supply voltage $V_{BATAMP2}$ at $2 \times V_{BAT}$.

The control circuit 52 may be provided in a separate circuit (e.g., a transceiver circuit) independent of the amplifier apparatus 48 and the tracker circuit 60. In this regard, the control circuit 52 may communicate with the amplifier apparatus 48 and the tracker circuit 60 via a first RF front-end (RFFE) interface 96 and a second RFFE interface 98, respectively. Alternatively, the control circuit 52 may be provided in the amplifier apparatus 48 or the tracker circuit 60.

Although the tracker circuit 60 is shown to include only the switcher circuit 62 and the main voltage amplifier circuit 64, it should be appreciated that the tracker circuit 60 may be simplified in FIG. 2 for the sake of simplicity and illustration. In a non-limiting example, the tracker circuit 60 can be configured to include additional switcher circuits and/or additional main voltage amplifier circuits. In this regard, the control circuit 52 may selectively couple the amplifier circuit 44 to any one of the switcher circuits and deactivate all the main voltage amplifier circuits in the tracker circuit 60 in response to activating the amplifier circuit 44 and the local voltage amplifier circuit 46. In contrast, the control circuit 52 may selectively couple the amplifier circuit 44 to any one of the switcher circuits and any one of the main voltage amplifier circuits in the tracker circuit 60 in response to activating the second amplifier circuit 86.

Figure 3:
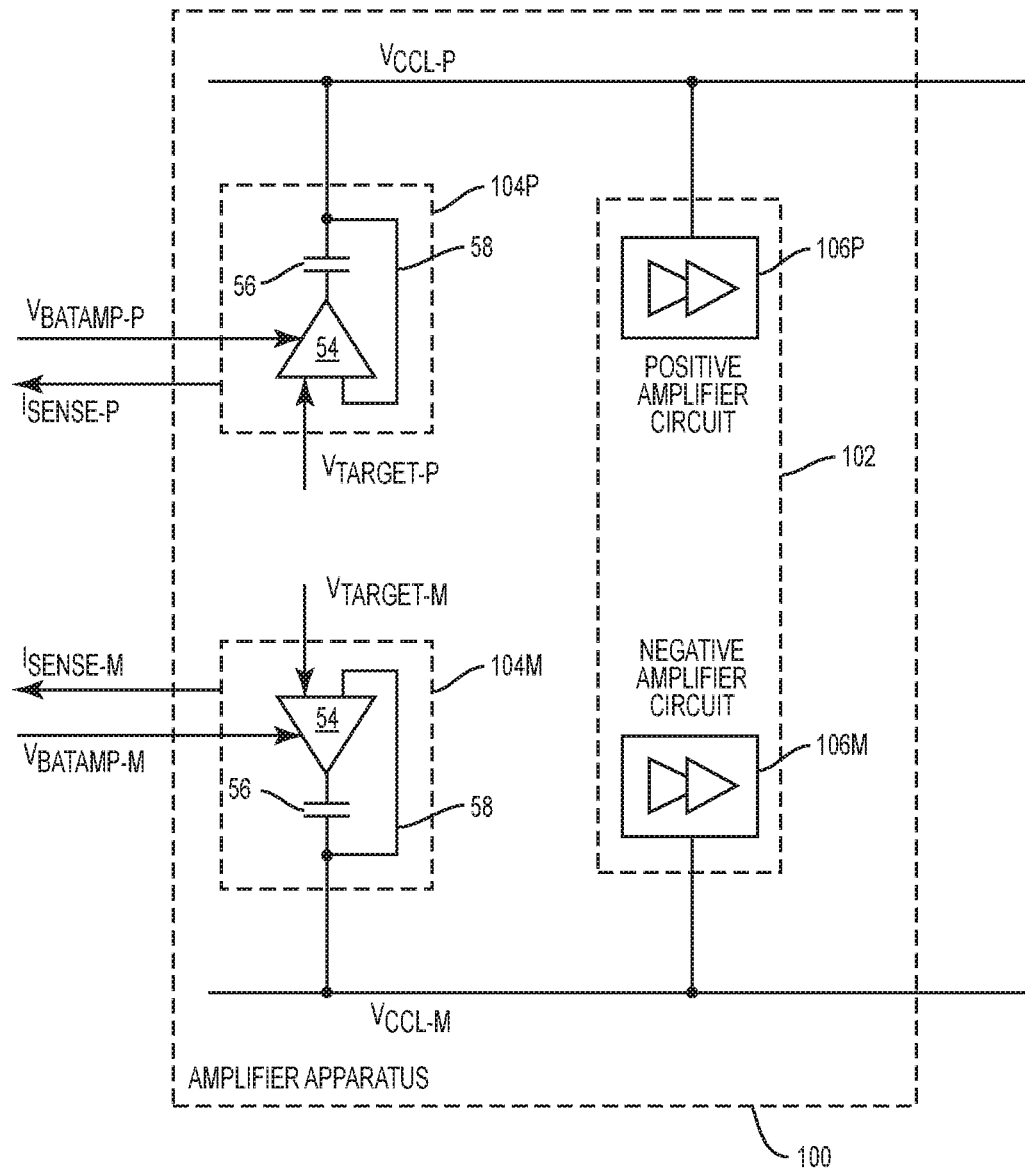
FIG. 3 is a schematic diagram of an exemplary amplifier apparatus configured according to an embodiment of the present disclosure to a differential amplifier circuit and a pair of local voltage amplifier circuit.

Notably, the amplifier circuit 44 in the amplifier apparatus 48 may be provided as a differential amplifier circuit. In this regard, FIG. 3 is a schematic diagram of an exemplary amplifier apparatus 100 configured according to an embodiment of the present disclosure to include a differential amplifier circuit 102, a local plus voltage amplifier circuit 104P, and a local minus voltage amplifier circuit 104M. Common elements between FIGS. 2 and 3 are shown therein with common element numbers and will not be re-described herein.

The differential amplifier circuit 102 includes a plus amplifier circuit 106P and a minus amplifier circuit 106M. In this regard, the local plus voltage amplifier circuit 104P is configured to provide a local modulated plus voltage $V_{CCL-P}$ to the plus amplifier circuit 106P and the local minus voltage amplifier circuit 104M is configured to provide a local modulated minus voltage $V_{CCL-M}$ to the minus amplifier circuit 106M.

Each of the local plus voltage amplifier circuit 104P and the local minus voltage amplifier circuit 104M is identical to the local voltage amplifier circuit 46 in the amplifier apparatus 48 of FIG. 2. In this regard, each of the local plus voltage amplifier circuit 104P and the local minus voltage amplifier circuit 104M includes the local voltage amplifier 54, the local offset capacitor 56, and the local feedback loop 58.

The local plus voltage amplifier circuit 104P is configured to generate the local modulated plus voltage $V_{CCL-P}$ based on a target plus voltage $V_{TARGET-P}$ and the local minus voltage amplifier circuit 104M is configured to generate the local modulated minus voltage $V_{CCL-M}$ based on a target minus voltage $V_{TARGET-M}$. In a non-limiting example, the target voltage de-multiplexer 82 (not shown) in FIG. 2 can be configured to provide the target plus voltage $V_{TARGET-P}$ and the target minus voltage $V_{TARGET-M}$ to both the local plus voltage amplifier circuit 104P and the local minus voltage amplifier circuit 104M.

The local plus voltage amplifier circuit 104P is configured to generate the local modulated plus voltage $V_{CCL-P}$ based on a supply plus voltage $V_{BATAMP-P}$ and the local minus voltage amplifier circuit 104M is configured to generate the local modulated minus voltage $V_{CCL-M}$ based on a supply minus voltage $V_{BATAMP-M}$. In a non-limiting example, the μLBB 94 (not shown) in FIG. 2 can be configured to provide the supply plus voltage $V_{BATAMP-P}$ and the supply minus voltage $V_{BATAMP-M}$ to both the local plus voltage amplifier circuit 104P and the local minus voltage amplifier circuit 104M.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) amplifier apparatus comprising:
    a tracker circuit comprising a main voltage amplifier circuit configured to generate a main modulated voltage;
    an amplifier apparatus coupled to the tracker circuit and comprising:
        a local voltage amplifier circuit configured to generate a local modulated voltage; and
        an amplifier circuit configured to amplify a radio frequency (RF) signal based on a modulated voltage; and
    a control circuit configured to:
        activate the amplifier circuit in response to the RF signal being modulated above a defined modulation bandwidth; and
        activate the local voltage amplifier circuit to provide the local modulated voltage to the amplifier circuit as the modulated voltage.

2. The ET amplifier apparatus of claim 1 wherein the control circuit is further configured to deactivate the main voltage amplifier circuit in response to activating the local voltage amplifier circuit.

3. The ET amplifier apparatus of claim 1 wherein the control circuit is further configured to:
    activate the amplifier circuit in response to the RF signal being modulated below the defined modulation bandwidth; and
    activate the local voltage amplifier circuit to provide the local modulated voltage to the amplifier circuit as the modulated voltage.

4. The ET amplifier apparatus of claim 1 wherein the amplifier circuit is coupled to the local voltage amplifier circuit by a conductive trace having a trace inductance below a defined threshold.

5. The ET amplifier apparatus of claim 1 wherein the amplifier apparatus is provided in a circuit separate from the tracker circuit.

6. The ET amplifier apparatus of claim 1 further comprising a second amplifier circuit configured to amplify the RF signal based on a second modulated voltage, wherein the control circuit is further configured to:
    activate the second amplifier circuit in response to the RF signal being modulated below the defined modulation bandwidth;
    activate the main voltage amplifier circuit to provide the main modulated voltage to the second amplifier circuit as the second modulated voltage; and
    deactivate the amplifier circuit and the local voltage amplifier circuit.

7. The ET amplifier apparatus of claim 6 wherein:
    the local voltage amplifier circuit is further configured to generate the local modulated voltage based on a first target voltage; and
    the main voltage amplifier circuit is further configured to generate the main modulated voltage based on a second target voltage.

8. The ET amplifier apparatus of claim 7 wherein the tracker circuit further comprises a target voltage de-multiplexer configured to:
    receive a modulated target voltage; and
    output the modulated target voltage as the first target voltage or the second target voltage based on a target voltage selection signal.

9. The ET amplifier apparatus of claim 8 wherein the control circuit is further configured to:
    provide the target voltage selection signal to the target voltage de-multiplexer to output the modulated target voltage as the first target voltage in response to activating the amplifier circuit and the local voltage amplifier circuit; and
    provide the target voltage selection signal to the target voltage de-multiplexer to output the modulated target voltage as the second target voltage in response to activating the second amplifier circuit and the main voltage amplifier circuit.

10. The ET amplifier apparatus of claim 6 wherein:
    the amplifier circuit is further configured to receive a first direct current and/or a first alternate current; and
    the second amplifier circuit is further configured to receive a second direct current and/or a second alternate current.

11. The ET amplifier apparatus of claim 10 wherein:
    the tracker circuit further comprises a switcher circuit configured to generate a direct current; and
    the control circuit is further configured to:
        couple the switcher circuit to the amplifier circuit to provide the direct current to the amplifier circuit as the first direct current in response to activating the amplifier circuit and the local voltage amplifier circuit; and
        couple the switcher circuit to the second amplifier circuit to provide the direct current to the second amplifier circuit as the second direct current in response to activating the second amplifier circuit and the main voltage amplifier circuit.

12. The ET amplifier apparatus of claim 11 wherein the switcher circuit comprises:
    a multi-level charge pump (MCP) configured to generate a multi-level voltage based on a battery voltage; and
    a current inductor configured to induce the direct current based on the multi-level voltage.

13. The ET amplifier apparatus of claim 11 wherein:
    the local voltage amplifier circuit is further configured to generate and provide the first alternate current to the amplifier circuit in response to being activated by the control circuit; and
    the main voltage amplifier circuit is further configured to generate and provide the second alternate current to the second amplifier circuit in response to being activated by the control circuit.

14. The ET amplifier apparatus of claim 13 wherein:
the local voltage amplifier circuit is further configured to generate a first sense current indicative of the first alternate current being sourced by the local voltage amplifier circuit; and
the main voltage amplifier circuit is further configured to generate a second sense current indicative of the second alternate current being sourced by the main voltage amplifier circuit.

15. The ET amplifier apparatus of claim 14 wherein the tracker circuit further comprises a sense current multiplexer configured to:
receive the first sense current and the second sense current from the local voltage amplifier circuit and the main voltage amplifier circuit, respectively; and
output a selected sense current among the first sense current and the second sense current in response to receiving a sense current selection signal.

16. The ET amplifier apparatus of claim 15 wherein the control circuit is further configured to:
provide the sense current selection signal to the sense current multiplexer to output the first sense current as the selected sense current in response to activating the amplifier circuit and the local voltage amplifier circuit; and
provide the sense current selection signal to the sense current multiplexer to output the second sense current as the selected sense current in response to activating the second amplifier circuit and the main voltage amplifier circuit.

17. The ET amplifier apparatus of claim 15 wherein the tracker circuit further comprises an ET controller configured to:
receive the selected sense current from the sense current multiplexer; and
control the switcher circuit to adjust the direct current based on the selected sense current.

18. The ET amplifier apparatus of claim 1 wherein:
the local voltage amplifier circuit is further configured to generate the local modulated voltage based on a first supply voltage; and
the main voltage amplifier circuit is further configured to generate the main modulated voltage based on a second supply voltage.

19. The ET amplifier apparatus of claim 18 wherein the tracker circuit further comprises a micro inductance-based buck-boost (μLBB) circuit configured to provide the first supply voltage and the second supply voltage to the local voltage amplifier circuit and the main voltage amplifier circuit.

20. The ET amplifier apparatus of claim 1 wherein:
the local voltage amplifier circuit comprises:
a local voltage amplifier configured to generate a local amplifier voltage; and
a local offset capacitor coupled to the local voltage amplifier and configured to raise the local amplifier voltage by a local offset voltage to generate the local modulated voltage; and
the main voltage amplifier circuit comprises:
a main voltage amplifier configured to generate a main amplifier voltage; and
a main offset capacitor coupled to the main voltage amplifier and configured to raise the main amplifier voltage by a main offset voltage to generate the main modulated voltage.

* * * * *

UNITED STATES PATENT AND TRADEMARK OFFICE
CERTIFICATE OF CORRECTION

PATENT NO. : 10,797,650 B2
APPLICATION NO. : 16/193513
DATED : October 6, 2020
INVENTOR(S) : Nadim Khlat Page 1 of 1

It is certified that error appears in the above-identified patent and that said Letters Patent is hereby corrected as shown below:

In the Specification

Column 7, Lines 8 and 20, replace "$V_{AMPS}$" with --$V_{AMPL}$--.

Signed and Sealed this
Twenty-second Day of December, 2020

Andrei Iancu
*Director of the United States Patent and Trademark Office*